United States Patent
Yang

(10) Patent No.: US 9,160,585 B2
(45) Date of Patent: Oct. 13, 2015

(54) DATA INTERFACE SYNCHRONIZATION

(75) Inventor: Wei-Lien Yang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,291

(22) PCT Filed: May 31, 2012

(86) PCT No.: PCT/US2012/040300
§ 371 (c)(1),
(2), (4) Date: Jun. 24, 2013

(87) PCT Pub. No.: WO2013/180724
PCT Pub. Date: Dec. 5, 2013

(65) Prior Publication Data
US 2014/0211894 A1    Jul. 31, 2014

(51) Int. Cl.
*H04L 7/00* (2006.01)
*H04L 25/40* (2006.01)
*H04L 25/49* (2006.01)
*H03M 9/00* (2006.01)

(52) U.S. Cl.
CPC ............ *H04L 25/40* (2013.01); *H04L 25/4902* (2013.01); *H03M 9/00* (2013.01)

(58) Field of Classification Search
CPC ..... H04J 3/0685; H04J 3/0632; H04J 3/0614; H04J 3/0691; H04N 5/04; H04L 12/56
USPC .......................................... 375/354; 341/100
See application file for complete search history.

(56) References Cited

U.S. PATENT DOCUMENTS

| | | | |
|---|---|---|---|
| 5,058,141 A * | 10/1991 | Kem et al. ...................... | 375/368 |
| 5,717,948 A | 2/1998 | Michalina | |
| 6,055,021 A * | 4/2000 | Twitchell ....................... | 348/513 |
| 6,104,770 A * | 8/2000 | Yama ............................. | 375/368 |
| 6,795,515 B1 | 9/2004 | Riedle et al. | |
| 7,272,677 B1 * | 9/2007 | Venkata et al. ................. | 710/71 |
| 7,369,069 B2 | 5/2008 | Usugi et al. | |
| 2003/0142233 A1 | 7/2003 | Eckhardt et al. | |
| 2007/0073942 A1 * | 3/2007 | Gregorius et al. .............. | 710/71 |
| 2007/0229342 A1 * | 10/2007 | Baba ............................. | 341/156 |
| 2008/0115020 A1 * | 5/2008 | Parulkar ........................ | 714/724 |
| 2013/0191679 A1 * | 7/2013 | Zhuang et al. ................. | 713/503 |

FOREIGN PATENT DOCUMENTS

KR    10-0850496 B1    8/2008

OTHER PUBLICATIONS

PCT International Search Report and Written Opinion issued in corresponding PCT/US2012/040300 dated May 31, 2012 (12 pages).

\* cited by examiner

*Primary Examiner* — Don N Vo
(74) *Attorney, Agent, or Firm* — Trop, Pruner & Hu, P.C.

(57) ABSTRACT

In one embodiment, an apparatus may include a de-serializer to convert serial data to parallel data, and a counter to provide an update signal based on a bit count of the serial data. The apparatus may further include a synchronizer to provide a synchronization signal when a target clock signal is synchronized with the update signal. The apparatus may further include an output unit to provide a validation indicator in response to the synchronization signal.

24 Claims, 9 Drawing Sheets

DATA INTERFACE SYNCHRONIZATION

BACKGROUND

Embodiments relate generally to data interfaces for electronic devices

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to increasing bandwidth requirements.

DETAILED DESCRIPTION

In some electronic devices, data interfaces between components may have to handle different input/output transfer rates for each component. In accordance with some embodiments, serial data from a transmitter may be de-serialized into parallel data, and may be synchronized to a target clock. In one or more embodiments, the parallel data may be provided to the receiver with a validation indicator, meaning an indication that the parallel data is synchronized with the target clock. Further, in some embodiment, the target component may ignore any parallel data received without the validation indicator.

Figure 1:
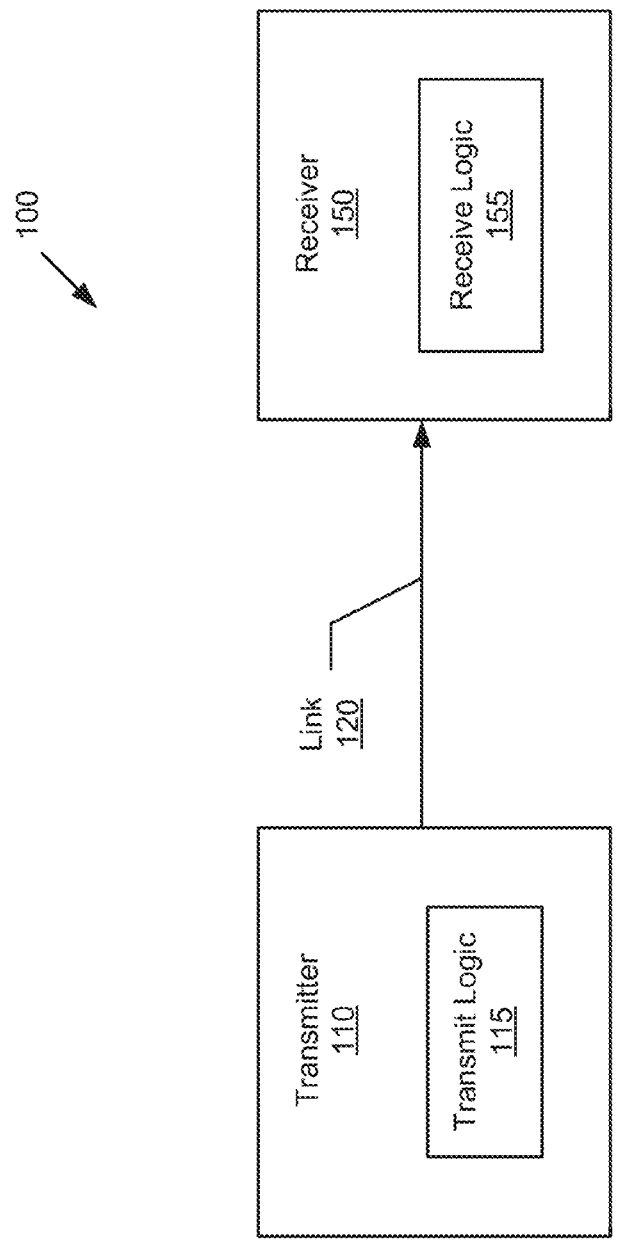
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a link 120 connecting a transmitter 110 and a receiver 150. In accordance with some embodiments, the apparatus 100 may be any electronic device, such as a cellular telephone, a computer, a media player, a network device, etc.

In some embodiments, the transmitter 110 and the receiver 150 may exist to connect any components or peripherals of the apparatus 100, such as a processor, a core, a memory device, a display device, a sound device, a wireless transceiver, a camera, etc. For example, in one or more embodiments, the receiver 150 may connect to a processor having a ten bit parallel data path. Note that, while only one pair of transmitter 110 and receiver 150 is shown for the sake of clarity, the example shown in FIG. 1 is not intended to be limiting. Accordingly, it should be appreciated that any number of such transmitter-receiver pairs may exist to connect various components of the apparatus 100.

In accordance with some embodiments, the link 120 may be any electrical or data connection (e.g., motherboard connection, input/output cable, network connector, bus, wireless link, etc.). In one or more embodiments, the transmitter 110 may include transmit logic 115 to manage data connections to the receiver 150. Further, in some embodiments, the receiver 150 may include receive logic 155 to manage the data connections from the transmitter 110.

In accordance with some embodiments, the link 120, the transmit logic 115, and the receive logic 155 may use one or more data interface protocols. For example, in some embodiments, the link 120, the transmitter 110, and the receiver 150 may use the M-PHY specification of the Mobile Industry Processor Interface (MIPI) Alliance (MIPI Specification for M-PHY Version 1.00.00 of Feb. 8, 2011, approved Apr. 28, 2011). In such embodiments, the link 120 may be a serial link carrying differential pulse width modulated (PWM) signals. Optionally, the PWM signals may be referred to as "self-clocking" if clock information is included in the period of the PWM waveform.

In one or more embodiments, the PWM signals of the link 120 may operate under one or more data rate ranges of the M-PHY specification (referred to as "GEARs"). For example, the link 120 may operate under GEAR 1 (3 Mbps to 9 Mbps), GEAR 2 (6 Mbps to 18 Mbps), GEAR 3 (12 Mbps to 36 Mbps), GEAR 4 (24 Mbps to 72 Mbps), GEAR 5 (48 Mbps to 144 Mbps), GEAR 6 (96 Mbps to 288 Mbps), GEAR 7 (192 Mbps to 576 Mbps), etc.

In accordance with some embodiments, the receive logic 155 may include functionality to de-serialize (i.e., convert to parallel data) the serial data received from the transmitter 110 (i.e., the PWM signals of the link 120). Further, in some embodiments, the receive logic 155 may also include functionality to synchronize the de-serialized data with the clock rate of the receiver 150. This functionality of the receive logic 155 is described further below with reference to FIGS. 2-6.

In one or more embodiments, the transmit logic 115 and/or the receive logic 155 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
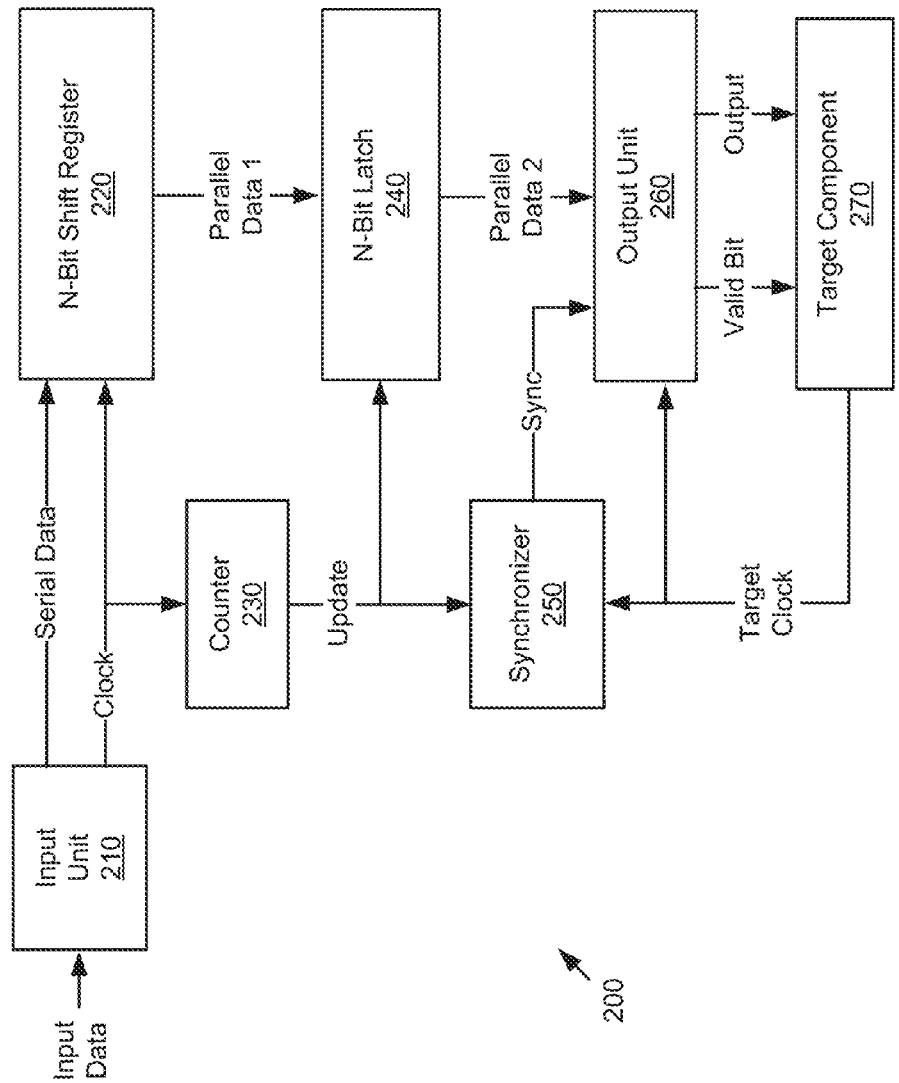
FIG. 2 is a block diagram of a system in accordance with one or more embodiments.

Referring to FIG. 2, shown is a block diagram of a receive logic 200 in accordance with one or more embodiments. More specifically, the receive logic 200 may generally correspond to all or a portion of the receive logic 155 shown in FIG. 1. As shown, an input signal may be received by the receive logic 200. In one or more embodiments, the input signal may be a PWM signal received from a transmitter 110 by way of the link 120.

In one or more embodiments, the input signal may be provided to an input unit 210, which may process the input signal to produce serial data and an associated clock signal (labeled "Clock"). For example, in some embodiments, the input unit 210 may convert differential PWM signals into a PWM single ended signal, and may then convert the PWM single ended signal into Non-Return Zero (NRZ) serial data. In such embodiments, the input unit 210 may include an amplifier. Further, in some embodiments, the input unit 210 may include functionality to analyze the waveform of self-clocking PWM signals (e.g., an edge detector) to obtain the clock signal for the serial data (e.g., a stream of pulses corresponding to the bits of data).

As shown in FIG. 2, the serial data and clock signal from the input unit 210 may be provided to an N-bit shift register 220. In one or more embodiments, the N-bit shift register 220 may operate in a Serial-In to Parallel-Out (SIPO) mode. In other words, the N-bit shift register 220 may store the serial data, one bit at a time, in response to the pulses of the clock signal. Thus, after N pulses, the N-bit shift register 220 may be filled (i.e., storing N bits of the serial data). Further, in some embodiments, the N bits stored in the N-bit shift register 220 may be read in parallel from N output terminals of the N-bit shift register 220. In this manner, the N-bit shift register 220 may operate to de-serialize the serial data into parallel data. For example, in some embodiments, the N-bit shift register 220 may be a 10 bit SIPO shift register (i.e., N=10).

As shown, the clock signal from the input unit 210 may also be provided to a counter 230. In one or more embodiments, the counter 230 may include functionality to count the pulses of the clock signal to determine the bit count of the serial data. Further, the counter 230 may include functionality to send an update signal (labeled "Update") for every N pulses of the clock signal (i.e., upon reaching a bit count equal to N). In some embodiments, the update signal may be provided to an N-bit latch 240 and a synchronizer 250.

In response to receiving the update signal, the N-bit latch 240 may read and store the N-bit parallel data output of the N-bit shift register 220 (labeled "Parallel Data 1"). In one or more embodiments, the N-bit latch 240 may operate in a transparent mode. For example, in some embodiments, the N-bit latch 240 may be a ten bit transparent latch, and may obtain the parallel data using a ten bit parallel data bus.

In accordance with some embodiments, the synchronizer 250 may include functionality to determine whether the update signal from the counter 230 is synchronized to a clock signal of a target component 270 (labeled "Target Clock"). For example, in the situation that the target component 270 is a processor, the target clock signal may be processor clock signal.

In one or more embodiments, the synchronizer 250 may output a synchronization signal (labeled "Sync") based on whether the update signal and the target clock signal are synchronized. For example, in some embodiments, the synchronizer 250 may output the synchronization signal when a pulse of the target clock signal occurs within a predefined time threshold before or after a pulse of the update signal. An example embodiment of the synchronizer 250 is discussed below with reference to FIG. 3.

As shown in FIG. 2, the output unit 260 may receive the synchronization signal from the synchronizer 250 and the target clock signal. In one or more embodiments, the output unit 260 may selectively read and store the N-bit parallel output of the N-bit latch 240 (labeled "Parallel Data 2") in response to receiving a pulse of the target clock signal. In one or more embodiments, the output unit 260 may include an N-bit flip-flop to store the parallel data. For example, in some embodiments, the output unit 260 may include a ten bit flip-flop, and may obtain the parallel data using a ten bit parallel data bus.

In accordance with some embodiments, output unit 260 may provide the stored parallel data (labeled "Output") to the target component 270. Further, in some embodiments, output unit 260 may provide a validity indicator (labeled "Valid Bit") to the target component 270 in response to receiving the synchronization signal. In some embodiments, the validity indicator may be a bit to indicate that the accompanying parallel data is synchronized to the clock signal of the target component 270.

In one or more embodiments, the target component 270 may include functionality to ignore any received parallel data that is not associated with a validity indicator. In some embodiments, the validity indicator may be associated with the parallel data if the validity indicator is received within a predefined time threshold before or after receiving the parallel data. For example, assume that the target component 270 is a processor which may only process parallel data if it is received with an associated validity indicator (e.g., a bit value). Accordingly, in this manner, the processor may be synchronized to a transmitter having a different data transfer rate. While shown with this particular implementation in the embodiment of FIG. 2, the scope of the various embodiments discussed herein is not limited in this regard.

Figure 3:
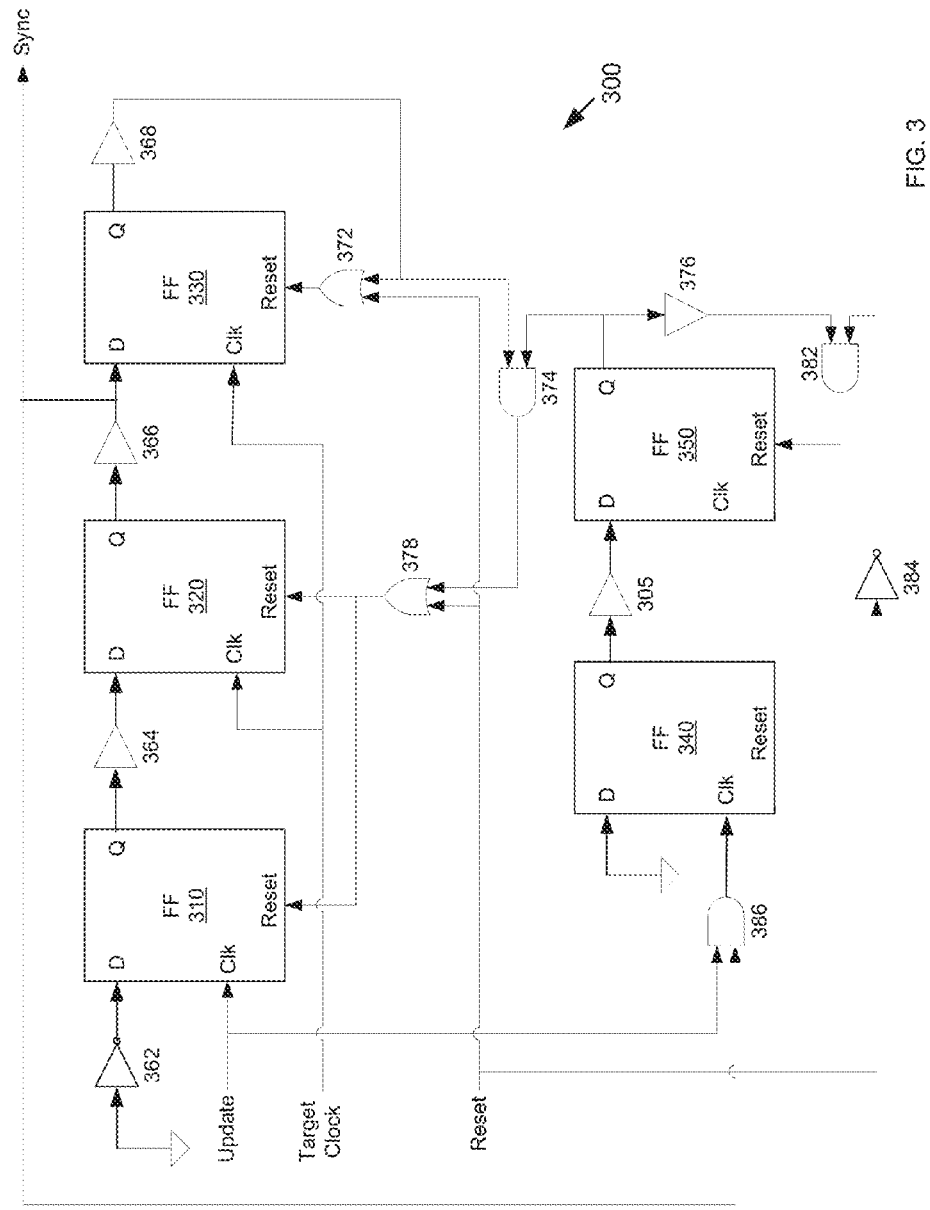
FIG. 3 is a block diagram of a system in accordance with one or more embodiments.

Referring now to FIG. 3, an example embodiment of a synchronizer 300 is shown in accordance with one or more embodiments. More specifically, the synchronizer 300 may generally correspond to all or a portion of the synchronizer 250 shown in FIG. 2. As shown, the synchronizer 300 may receive the update signal and the target clock signal (described above with reference to FIG. 2). Further, the synchronizer 300 may also receive a reset signal.

As shown in FIG. 3, in one or more embodiments, the update signal may be provided to a clock input of a flip-flop (FF) 310. The data input to FF 310 may be a ground signal passed through an inverter 362, and may thus provide a logical high signal (e.g., "1"). The output signal of FF 310 may be passed through a buffer 364 and may be coupled to the data input of FF 320. The output signal of FF 320 may be passed through a buffer 366 and may be provided to the data input of FF 330. Further, the output signal of FF 320 is output by the synchronizer 250 as the synchronization signal (described above with reference to FIG. 2). In addition, the output signal of FF 320 is provided, along with the update signal, to an AND gate 386. The output of the AND gate 386 is coupled to the clock input of FF 340.

As shown, the target clock signal is provided to the clock inputs of the FF 320 and the FF 330. The output of FF 330 may be passed through a buffer 368, and may be provided, along with the reset signal, to an OR gate 372. The output of OR gate 372 may be coupled to the reset input of FF 330. Further, the output of buffer 368 may also be provided, along with the output of FF 350, to an AND gate 372. The output of AND gate 372 may be provided, along with the reset signal, to an OR gate 378. The output of OR gate 378 may be coupled to the reset inputs of FF 310 and FF 320.

As shown in FIG. 3, the data input to FF 340 may be a ground signal equivalent to a logical low value (e.g., "0"). The output of FF 340 may be passed through a buffer 305 and may be provided to a data input of FF 350. The output of FF 350 may be passed through a buffer 376 and may be provided to a first input of an AND gate 382. The second input to AND gate 382 may be the reset signal passed through an inverter 384. The output of AND gate 382 may be coupled to the reset input of FF 350.

Note that the examples shown in FIGS. 1-3 are provided for the sake of illustration, and are not intended to limit any embodiments. For example, embodiments may include any number and/or arrangement of transmitters 110 and/or receivers 150. In another example, the parallel data devices described above may be implemented using any number N of parallel bits (e.g., 2, 8, 20, 50, 100, etc.). In yet another example, it is contemplated that some embodiments may include any number of components in addition to those shown, and that different arrangement of the components shown may occur in certain implementations. Further, it is contemplated that specifics in the examples shown in FIGS. 1-3 may be used anywhere in one or more embodiments.

Figure 4:
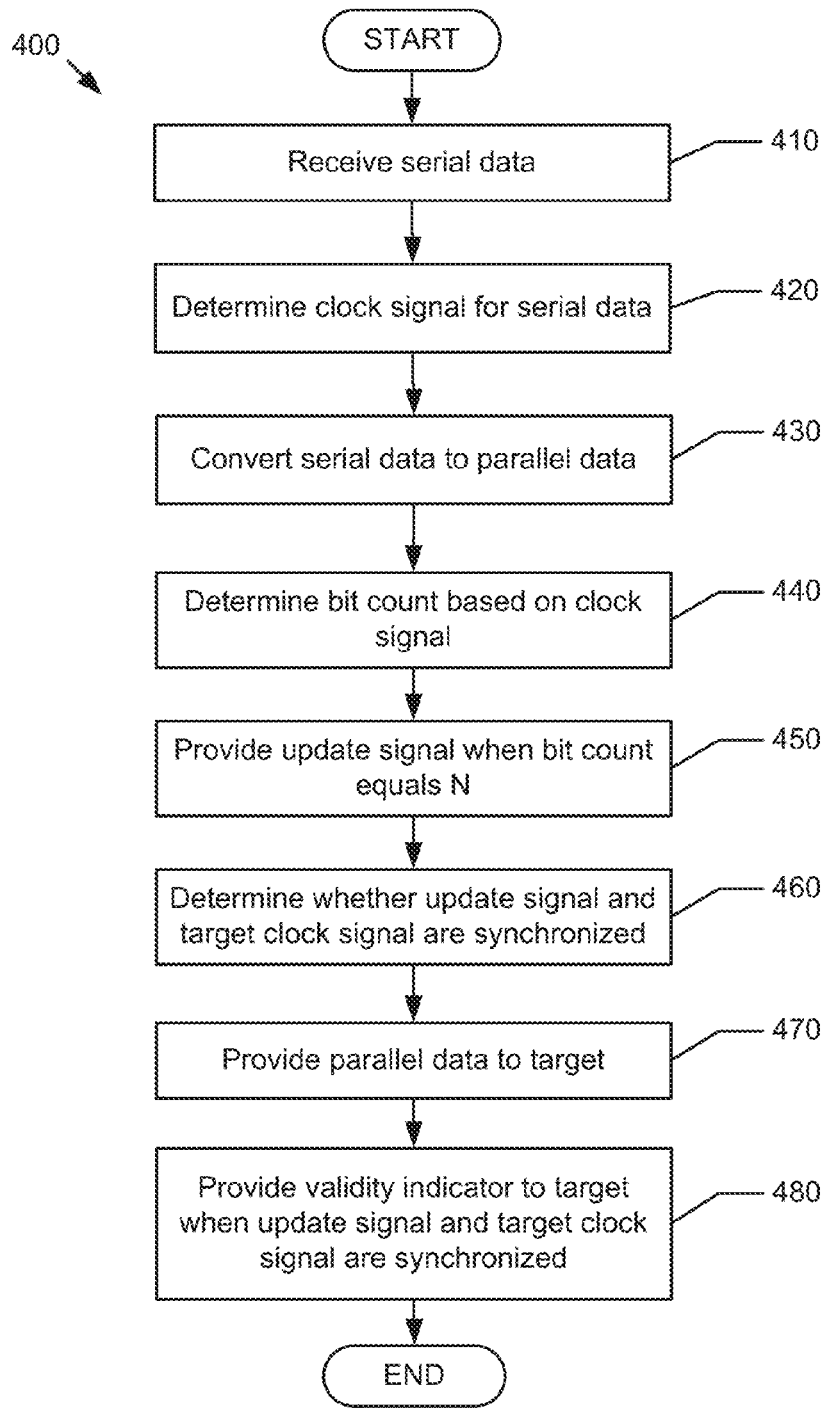
FIG. 4 is a flow chart of a method in accordance with one or more embodiments.

FIG. 4 shows a sequence 400 for signal synchronization in accordance with one or more embodiments. In one embodiment, the sequence 400 may be part of the receive logic 115 shown in FIG. 1. In other embodiments, the sequence 400 may be implemented by any other part of receiver 150. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, serial data may be received. For example, referring to FIG. 2, the input logic 210 may receive differential PWM signals operating under the M-PHY specification. In one or more embodiments, the input logic 210 may convert the differential PWM signals into NRZ serial data.

At step 420, the clock signal for the received serial data may be determined. For example, referring to FIG. 2, the input logic 210 may analyze the waveform of the PWM signal to determine the clock rate. In one or more embodiments, the input logic 210 may use an edge detector to determine the clock rate.

At step 430, the serial data may be converted to parallel data. For example, referring to FIG. 2, the N-bit shift register 220 may store N bits of the serial data. Further, the N-bit shift register 220 may provide all N bits in a parallel output, thereby de-serializing the received data stream.

At step 440, a bit count may be determined based on the clock rate. For example, referring to FIG. 2, the counter 230 may count bits based on the clock rate provided by the input logic 210. In one or more embodiments, the counter 230 may be configured to count to a predefined number N (e.g., 2, 10, 20, etc.).

At step 450, an update signal may be provided when the bit count reaches a predefined number N. For example, referring to FIG. 2, the counter 230 may provide an update signal when the count reaches ten bits. In one or more embodiments, after providing the update signal, the counter 230 may reset the count to zero.

At step 460, a determination is made about whether the update signal and a target clock signal are synchronized. For example, referring to FIG. 2, the synchronizer 250 may determine whether the update signal provided by the counter 230 and the clock signal of the target component 270 are synchronized. In one or more embodiments, this determination may be based on whether a pulse of the target clock signal occurs within a predefined time threshold after a pulse of the update signal. Further, in some embodiments, this determination may be performed using all or part of the digital logic shown in FIG. 3.

At step 470, the stored parallel data may be provided to the target component. For example, referring to FIG. 2, the output unit 260 may provide the parallel data to the target component 270. For example, the output unit 260 may provide the parallel data transparently, in response to the target clock signal, and/or in response to the synchronization signal.

At step 480, a validity indicator may be provided to the target component in response to determining that the update signal and the target clock signal are synchronized. For example, referring to FIG. 2, the output unit 260 may, in response to receiving the synchronization signal from the synchronizer 250, provide the validity indicator (e.g., a bit indicating that the update signal and the target clock signal are synchronized) to the target component 270. In some embodiments, the target component 270 may be configured to ignore the parallel data if it is not received with the associated validity indicator. After step 480, the sequence 400 ends.

Figure 5A:
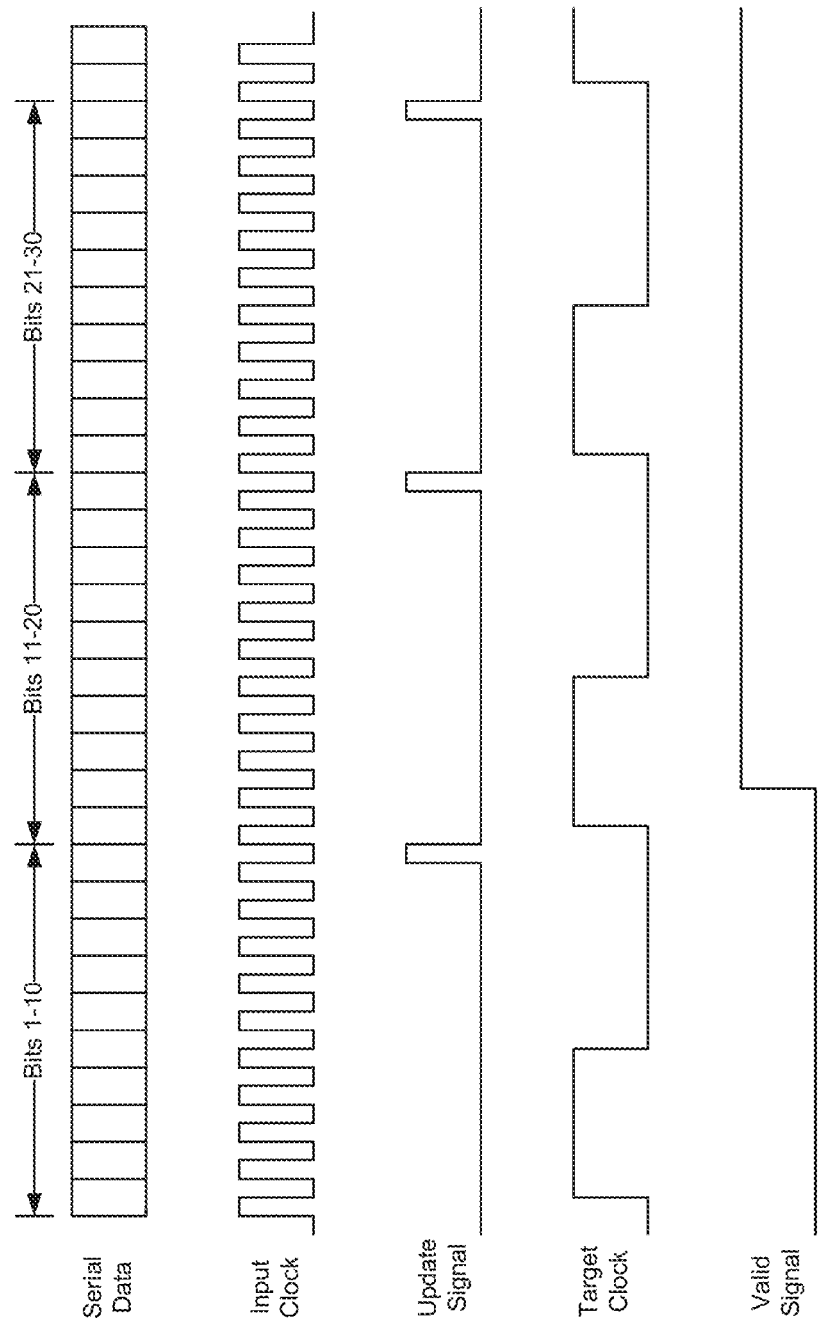
FIGS. 5A-5B are timing diagrams of systems in accordance with one or more embodiments.

Referring to FIG. 5A, an example is shown in accordance to some embodiments. Specifically, FIG. 5A may correspond to an example in which the target component 270 (shown in FIG. 2) is a processor having a ten bit parallel data path (i.e., N=10). Further, FIG. 5A may correspond to an example in which the received serial data rate is equal to input data rate of the processor (e.g., 6 Mbps).

As shown in FIG. 5A, the input clock signal ("Input Clock") includes pulses corresponding to the bits of the received serial data ("Serial Data"). In this example, the counter 230 (shown in FIG. 2) is set to count to N=10. Accordingly, the update signal from the counter 230 ("Update Signal") includes a pulse for each set of ten bits of the serial data.

As shown, a second pulse of the clock signal of the processor ("Target Clock") occurs after the first pulse of the update signal. In this example, the synchronizer 250 (shown in FIG. 2) determines that the pulses of the update signal and the target clock signal are synchronized, and thus may provide a pulse in a synchronization signal (not shown). Further, in response to the pulse in the synchronization signal, the output logic 260 (shown in FIG. 2) may provide a pulse in a validation signal ("Valid Signal"). Note that, because the input and processor data rates are the same, the target clock signal and the update signal have the same pulse frequency, and thus remain synchronized. Accordingly, as shown, the valid signal remains high, thereby indicating that the processor may use each transmission of parallel data.

Figure 5B:
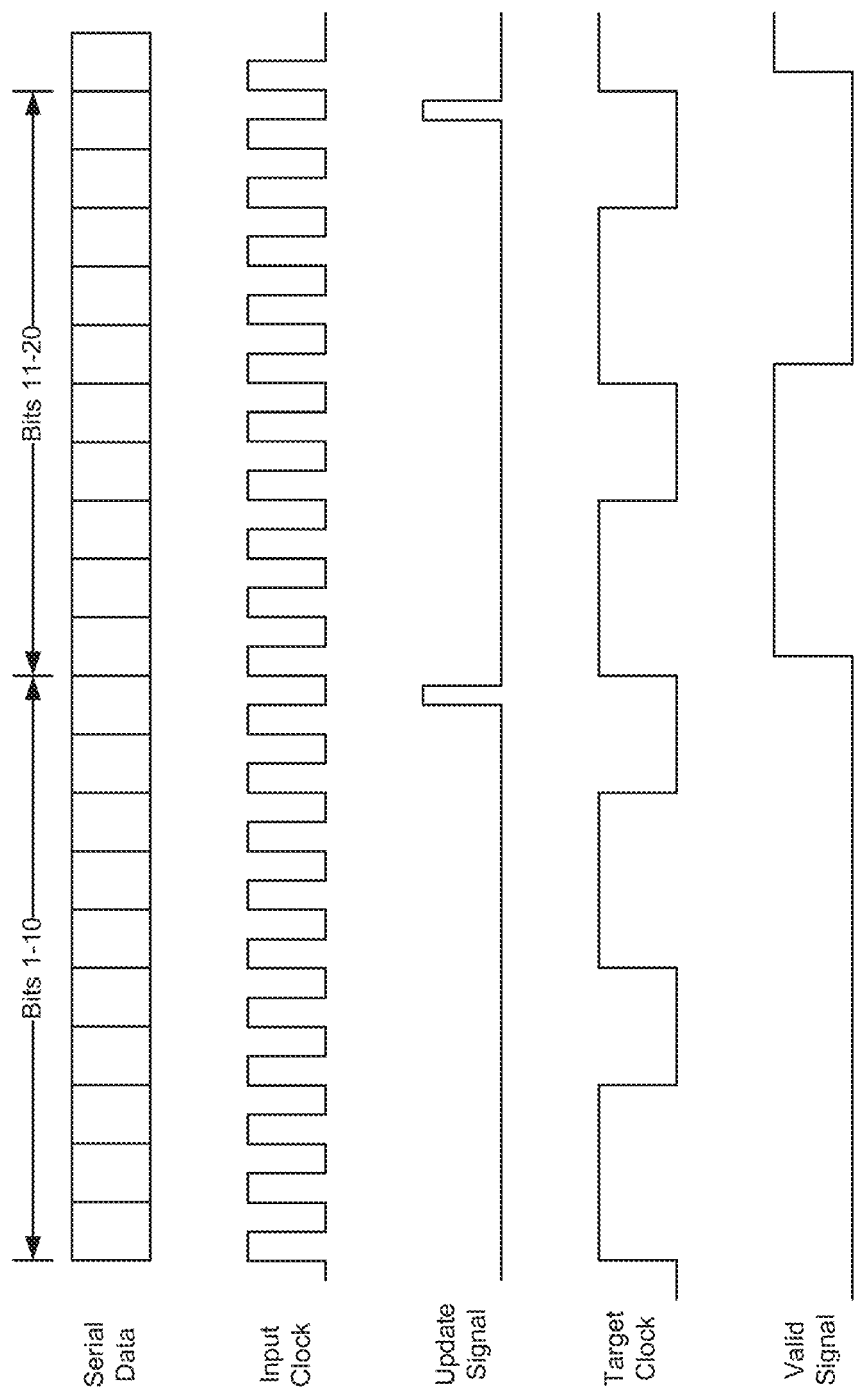

Referring to FIG. 5B, an example is shown in accordance to some embodiments. Specifically, FIG. 5B may correspond to an example in which the target component 270 is a processor having a ten bit parallel data path, and in which the received serial data rate is less than (e.g., one half) the input data rate of the processor.

As shown in FIG. 5B, the update signal again includes a pulse for each set of ten bits of the serial data. However, in this example, the target clock signal of the processor includes two pulses for every pulse of the update signal. Thus, the synchronizer 250 may determine that the first instance of synchronization occurs with the first pulse of the update signal and the third pulse of the target clock signal. Accordingly, as shown, the first pulse of the validation signal occurs after the third pulse of the target clock signal.

Note that, in this example, the fourth pulse of the target clock signal occurs before a new pulse of the update signal. Therefore, as shown, the validation signal returns to a low value after the fourth pulse of the target clock signal, thereby indicating that the processor should not use any parallel data received during this period.

Figure 6:
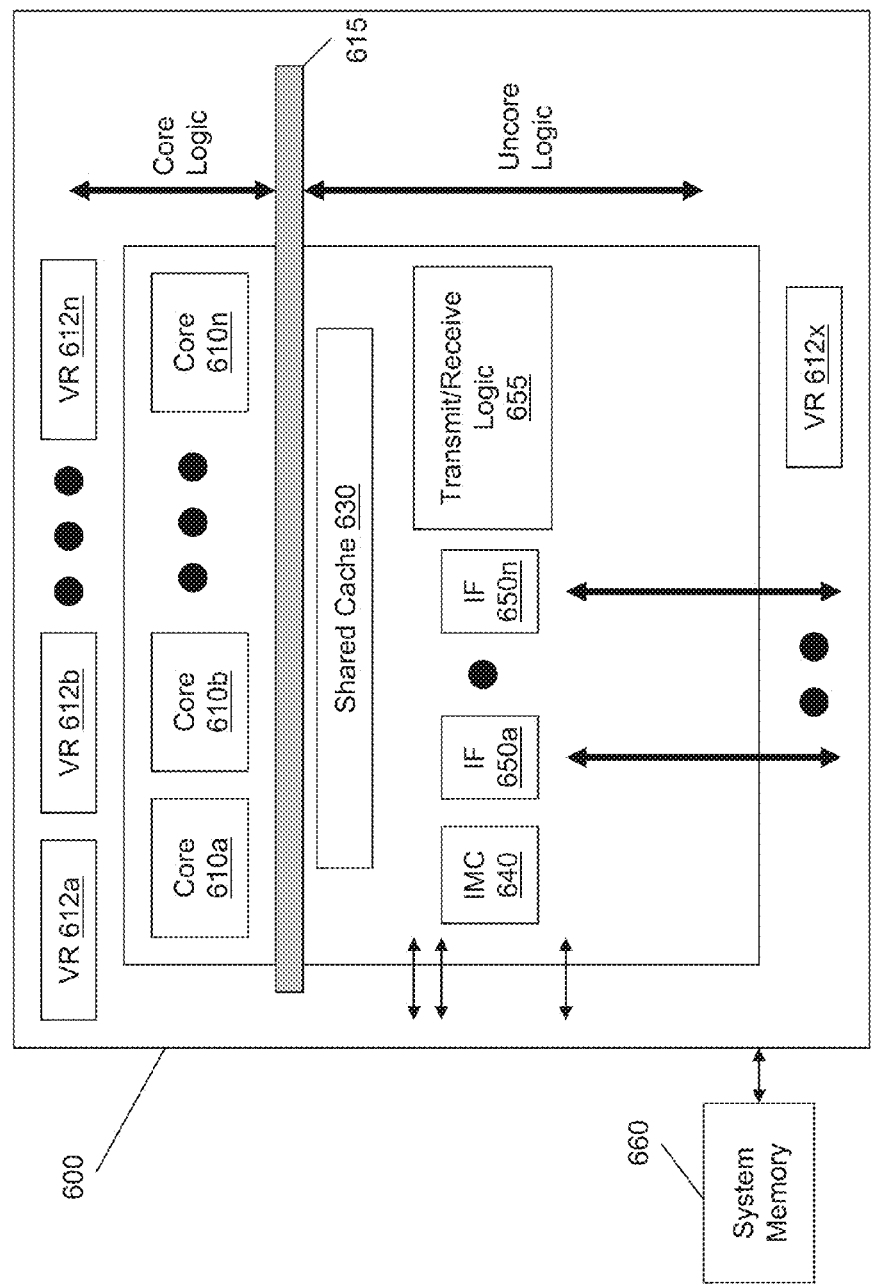
FIG. 6 is a block diagram of a processor core in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and transmit/receive logic 655.

In one or more embodiments, transmit/receive logic 655 may include all or a portion of the receive logic 200 described above with reference to FIG. 2. Thus, the transmit/receive logic 655 may enable the cores 610a-610n to synchronize data transfer with other components (e.g., components included in a mobile computing device).

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
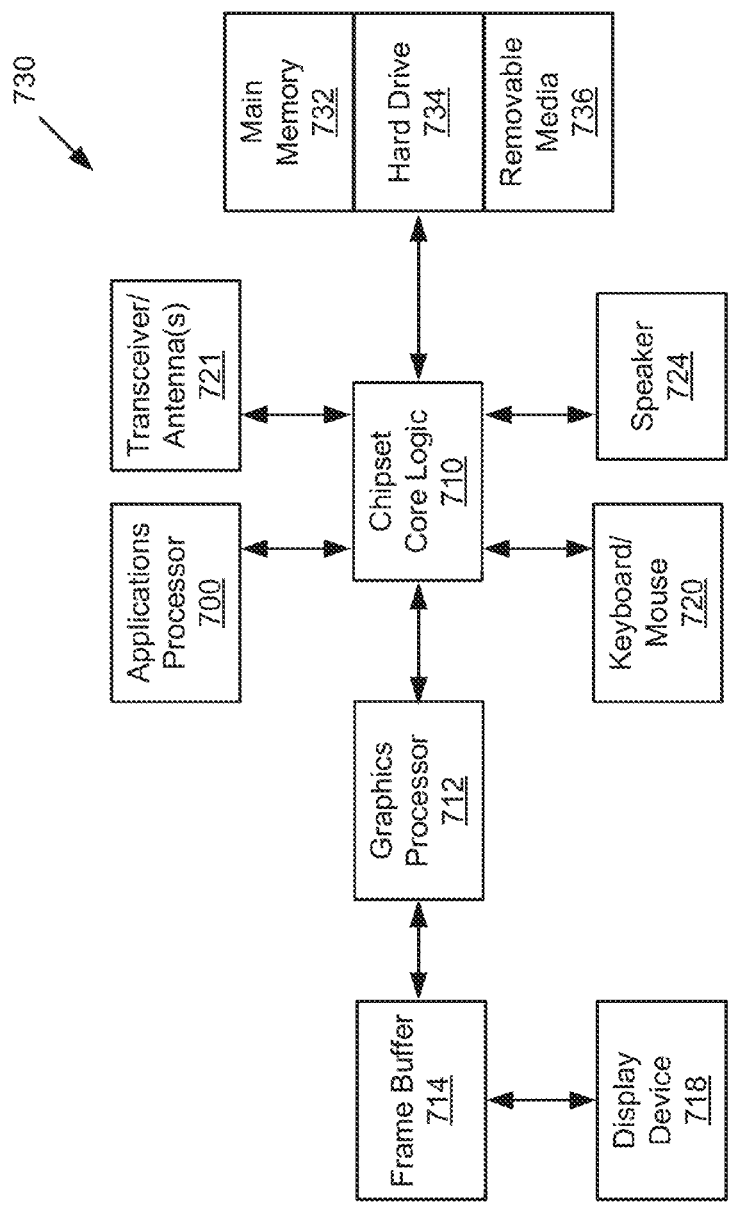
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multi-threaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721, 722. Speakers 724 may also be coupled to core logic 710.

Figure 8:
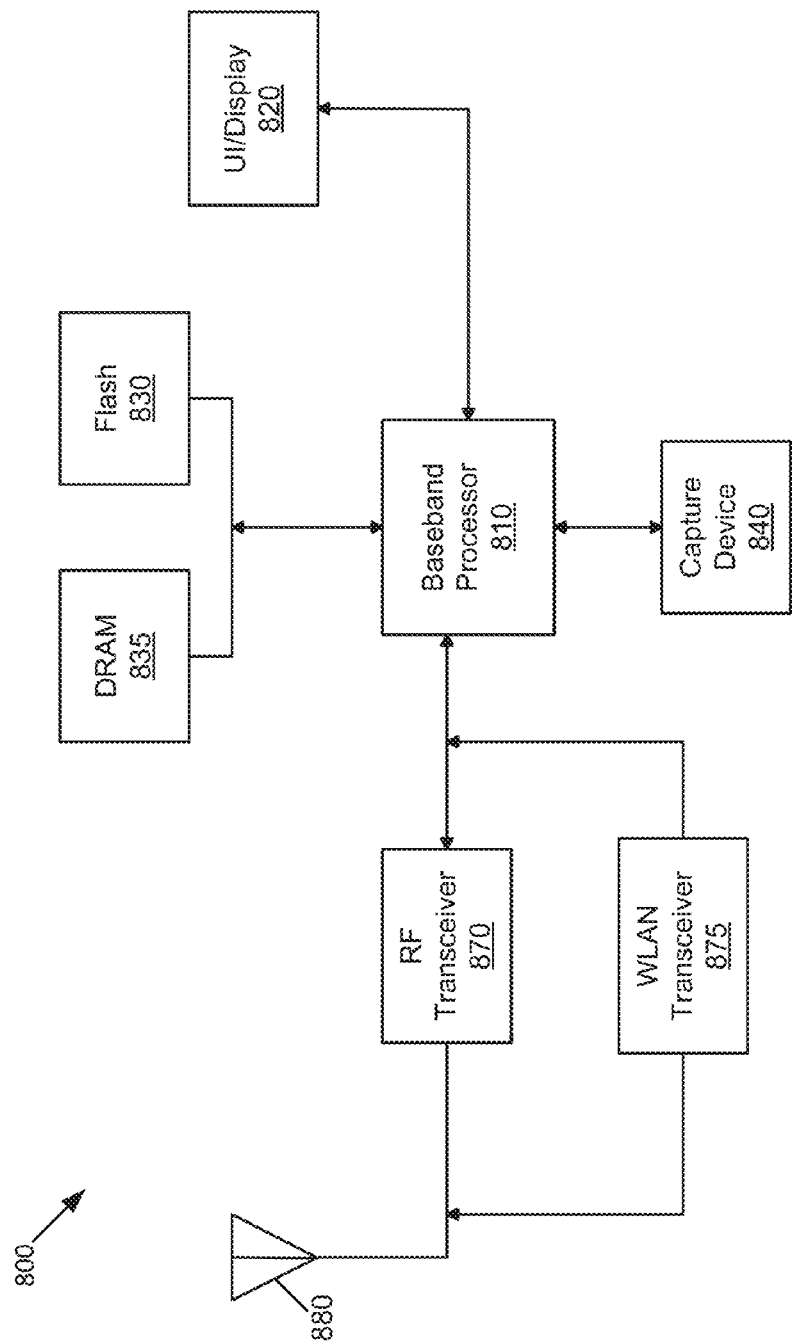
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display. In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images.

To enable communications to be transmitted and received, various circuitry may be coupled between baseband processor 810 and an antenna 880. Specifically, a radio frequency (RF) transceiver 870 and a wireless local area network (WLAN) transceiver 875 may be present. In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a de-serializer to convert serial data to parallel data; a counter to provide an update signal based on a bit count of the serial data; a synchronizer to provide a synchronization signal when a target clock signal is synchronized with the update signal; and an output unit to provide a validation indicator in response to the synchronization signal. The output unit may also be to provide the parallel data. The apparatus may further include a target component to receive the validation indicator and the parallel data from the output unit. The target component may also be to ignore the parallel data unless it is received with the validation indicator. The target component may be a processor. The de-serializer may be an N-bit shift register. The apparatus may further include an N-bit latch to store the parallel data, where the N-bit latch is coupled to the output of the N-bit shift register. The output unit may be coupled to the output of the N-bit latch. The validation indicator may be a bit to indicate that the parallel data is synchronized to the target clock signal. The apparatus may also include an input unit to provide the serial data to the de-serializer based on pulse width modulated (PWM) signals. The input unit may be also to determine a clock signal based on the serial data. The input unit may include an amplifier. The PWM signals may conform to the Mobile Industry Processor Interface (MIPI) M-PHY Specification. The apparatus may also include a ten bit wide parallel bus for the parallel data. The synchronizer may include a first flip-flop (FF) and a first buffer, where the first FF is to receive the update signal at a clock input and to provide an output to the first buffer. The synchronizer may also include a second FF to receive the target clock signal at a clock input, where a data input of the second FF is coupled to the first buffer.

Another example embodiment may be a system including: a system on a chip comprising at least one core having at least one execution unit and receiver logic, the receiver logic including a de-serializer to convert serial data to parallel data, and a synchronizer to determine whether the parallel data is synchronized with a clock signal of the at least one core. The system may also include a wireless device coupled to the system on the chip via an interconnect, where the interconnect is used to communicate data between the wireless device and the receiver logic of the system on the chip. The receiver logic may also include a counter to provide an update signal based on a bit count of the serial data. The synchronizer may be to use the update signal. The receiver logic may also include a latch to receive the parallel data from the de-serializer. The receiver logic may also include a flip-flop to receive the parallel data from the latch. The de-serializer may be a shift register.

Yet another example embodiment may be a method including: de-serializing serial data to obtain parallel data of width N; providing an update signal for every N bits of the serial data; and determining whether a target clock signal is synchronized with the update signal. The method may also include providing a synchronization signal in response to determining that the target clock signal is synchronized with the update signal. The method may also include providing a validation indicator in response to the synchronization signal. The method may also include receiving the parallel data at a first time; receiving the validation indicator at a second time; and determining whether the parallel data is associated with the validation indicator based on the first time and the second time. The method may also include using the parallel data only if the parallel data is associated with the validation indicator.

Still another example embodiment may be a microcontroller executing in relation to a receiving logic unit, the microcontroller arranged to perform the above described method.

A further example embodiment may a communication device arranged to perform the above described method.

Another example embodiment may be at least one machine readable medium comprising a plurality of instructions that in response to being executed on a computing device, cause the computing device to carry out the above described method.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
   a de-serializer to convert serial data to parallel data;
   a counter to provide an update signal based on a bit count of the serial data;
   a target component to provide a target clock signal;
   a synchronizer to provide a synchronization signal when the target clock signal provided by the target component is synchronized with the update signal; and
   an output unit to provide a validation indicator in response to the synchronization signal.

2. The apparatus of claim 1, wherein the output unit is also to provide the parallel data.

3. The apparatus of claim 2, wherein the target component is to receive the validation indicator and the parallel data from the output unit.

4. The apparatus of claim 3, wherein the target component is to ignore the parallel data unless it is received with the validation indicator.

5. The apparatus of claim 1, wherein the target component is a processor.

6. The apparatus of claim 1, wherein the de-serializer is an N-bit shift register.

7. The apparatus of claim 6, further comprising an N-bit latch to store the parallel data, wherein the N-bit latch is coupled to the output of the N-bit shift register.

8. The apparatus of claim 7, wherein the output unit is coupled to the output of the N-bit latch.

9. The apparatus of claim 1, wherein the validation indicator is a bit to indicate that the parallel data is synchronized to the target clock signal.

10. The apparatus of claim 1, further comprising an input unit to provide the serial data to the de-serializer based on pulse width modulated (PWM) signals.

11. The apparatus of claim 10, wherein the input unit is also to determine a clock signal based on the serial data.

12. The apparatus of claim 10, wherein the input unit comprises an amplifier.

13. The apparatus of claim 10, wherein the PWM signals are to conform to the Mobile Industry Processor Interface (MIPI) M-PHY Specification.

14. A system comprising:
   a system on a chip comprising at least one core having at least one execution unit and receiver logic, the receiver logic comprising:
     a de-serializer to convert serial data to parallel data;
     a synchronizer to provide a synchronization signal to an output unit when the parallel data is synchronized with a clock signal of the at least one core;
     the output unit to provide a validation indicator and the parallel data to the at least one core, wherein the validation indicator indicates that the parallel data is synchronized with a clock signal of the at least one core; and
   a wireless device coupled to the system on the chip via an interconnect, the interconnect used to communicate data between the wireless device and the receiver logic of the system on the chip.

15. The system of claim 14, wherein the receiver logic further comprises a counter to provide an update signal based on a bit count of the serial data.

16. The system of claim 15, wherein the synchronizer is to use the update signal to determine whether the parallel data is synchronized with the clock signal of the at least one core.

17. The system of claim 14, wherein the receiver logic further comprises a latch to receive the parallel data from the de-serializer.

18. The system of claim 17, wherein the receiver logic further comprises a flip-flop to receive the parallel data from the latch.

19. The system of claim 14, wherein the at least one core is to ignore the parallel data unless it is received with the validation indicator.

20. A method comprising:
   de-serializing serial data to obtain parallel data of width N;
   providing an update signal for every N bits of the serial data;
   determining whether a target clock signal of a target component is synchronized with the update signal;

providing a synchronization signal to an output unit in response to a determination that the target clock signal is synchronized with the update signal; and providing, by the output unit, a validation indicator to the target component in response to the synchronization signal.

21. The method of claim 20, wherein determining that the target clock signal is synchronized with the update signal is performed by a synchronizing unit.

22. The method of claim 21, further comprising providing the target clock signal from the target component to the synchronizing unit.

23. The method of claim 20, further comprising:
receiving, by the target component, the parallel data at a first time;
receiving, by the target component, the validation indicator at a second time; and
determining, by the target component, whether the parallel data is associated with the validation indicator based on the first time and the second time.

24. The method of claim 23, further comprising using the parallel data only if the parallel data is associated with the validation indicator.

\* \* \* \* \*